(12) United States Patent
Beeson et al.

(10) Patent No.: US 8,609,470 B2
(45) Date of Patent: Dec. 17, 2013

(54) SEMICONDUCTING SHEET

(75) Inventors: Karl W. Beeson, Princeton, NJ (US); Scott M. Zimmerman, Basking Ridge, NJ (US); William R. Livesay, San Diego, CA (US); Richard L. Ross, Del Mar, CA (US)

(73) Assignee: Goldeneye, Inc., San Diego, CA (US)

( * ) Notice: Subject to any disclaimer, the term of this patent is extended or adjusted under 35 U.S.C. 154(b) by 64 days.

(21) Appl. No.: 13/506,383

(22) Filed: Apr. 16, 2012

(65) Prior Publication Data

US 2012/0205683 A1 Aug. 16, 2012

Related U.S. Application Data

(63) Continuation of application No. 12/317,635, filed on Dec. 23, 2008, now Pat. No. 8,158,983.

(60) Provisional application No. 61/010,077, filed on Jan. 3, 2008, provisional application No. 61/196,439, filed on Oct. 17, 2008.

(51) Int. Cl.
*H01L 21/50* (2006.01)
*H01L 21/56* (2006.01)

(52) U.S. Cl.
USPC ............ 438/125; 438/26; 438/34; 438/64; 438/110; 257/E21.499; 257/E21.504

(58) Field of Classification Search
USPC ......... 257/E21.499, E21.504; 438/26, 34, 64, 438/110, 125
See application file for complete search history.

(56) References Cited

U.S. PATENT DOCUMENTS

| | | | | |
|---|---|---|---|---|
| 3,133,336 | A | * | 5/1964 | Marinace ................. 438/413 |
| 4,467,193 | A | | 8/1984 | Carroll |
| 5,733,369 | A | * | 3/1998 | Yonehara et al. ........... 117/89 |
| 5,771,617 | A | | 6/1998 | Baker |
| 5,925,897 | A | * | 7/1999 | Oberman .................. 257/80 |
| 6,045,240 | A | * | 4/2000 | Hochstein ................ 362/294 |
| 6,864,570 | B2 | * | 3/2005 | Smith ..................... 257/703 |
| 7,001,608 | B2 | * | 2/2006 | Fishman et al. ........... 424/427 |
| 7,052,924 | B2 | | 5/2006 | Daniels et al. |
| 7,217,956 | B2 | | 5/2007 | Daniels et al. |
| 7,259,030 | B2 | | 8/2007 | Daniels et al. |
| 7,294,961 | B2 | | 11/2007 | Daniels et al. |
| 7,786,490 | B2 | * | 8/2010 | Chen ...................... 257/79 |
| 2008/0029850 | A1 | * | 2/2008 | Hedler et al. ............. 257/621 |
| 2008/0092378 | A1 | * | 4/2008 | Chujo et al. ............... 29/852 |

* cited by examiner

*Primary Examiner* — Victor A Mandala
(74) *Attorney, Agent, or Firm* — William Propp, Esq.

(57) ABSTRACT

A substrate-free semiconducting sheet has an array of semiconducting elements dispersed in a matrix material. The matrix material is bonded to the edge surfaces of the semiconducting elements and the substrate-free semiconducting sheet is substantially the same thickness as the semiconducting elements.

10 Claims, 13 Drawing Sheets

SEMICONDUCTING SHEET

CROSS REFERENCES TO RELATED APPLICATIONS

This application is a continuation of prior U.S. patent application Ser. No. 12/317,635, filed on Dec. 23, 2008 now U.S. Pat. No. 8,158,983, claims the benefit of U.S. Provisional Patent Application Ser. No. 61/010,077, which was filed Jan. 3, 2008, and of U.S. Provisional Patent Application Ser. No. 61/196,439, which was filed on Oct. 17, 2008, all of which are herein incorporated by reference.

TECHNICAL FIELD

The invention is a substrate-free semiconducting sheet that includes an array of semiconducting elements that are bonded together using a matrix material. Methods are described for fabricating the substrate-free semiconducting sheets.

BACKGROUND OF THE INVENTION

The need exists for large area semiconducting devices such as displays, solar panels, and general illumination sources. High performance semiconducting devices, however, typically require wafer based processing. This is due to the need for epitaxial processes, which require single-crystal growth substrates. While amorphous and polycrystalline processes have been developed for the growth of semiconducting materials on glass and metals, in all cases some compromise in device performance is required. Even in the case of organic semiconducting devices, such as organic light emitting diodes (OLEDs), organic solar cells and electronic devices, high performance devices are typically formed via vapor processes within controlled atmospheres. The highest performance devices still benefit from batch based approaches. The need therefore exists for methods in which individual semiconductor elements, which are made using more standard semiconductor processes, can be reassembled into larger devices. In many cases, only a portion of the surface area needs to be covered with the semiconducting elements. This is especially true in the case of displays and general illumination sources. In general lighting applications, brightness levels less than 3000 foot-Lamberts (ftL) are typically preferred and in display applications typical brightness levels of 100 to 200 ftL are used. In many cases, the ability to use the extra surface area for interconnections, addressing elements, conversion materials, energy storage, and a black matrix for enhanced contrast is desirable. In the case of solar applications, the ability to incorporate a concentrator is also advantageous. In many cases the combination of multiple functionalities is desirable (e.g. light emitting diode, solar cell, charge storage, etc.).

While several authors have disclosed methods arraying a variety of semiconducting elements onto a variety of substrate materials, the methods still require a substrate. Carroll in U.S. Pat. No. 4,467,193 and Baker in U.S. Pat. No. 5,771,617 both disclose an array of embedded light emitting diode (LED) chips within a transparent body. Daniels et al in U.S. Pat. Nos. 7,052,924, 7,217,956, 7,259,030, and 7,294,961 disclose the use of a roll-to-roll process and a lamination process to interconnect LEDs and solar cells via transparent conductive sheets. In these cases, some type of supporting substrate is required. The ability to stack, repair, and thermally cool the semiconducting elements is hindered by this approach. In addition, the physical separation and optical properties of the laminating films limit how effectively light can be extracted or impinged on the semiconducting elements. More specifically, high quality displays require contrast enhancement techniques that do not lend themselves to this type of processing. Solar applications involving concentrators are also adversely impacted by this approach.

It would be desirable to create a semiconducting sheet in which a variety of flake-like or chip-like semiconducting elements are arrayed within the sheet such that the thickness of these flake-like or chip-like semiconducting elements is substantially the same as the thickness of the semiconducting sheet. It would also be desirable to create a sheet of semiconducting elements such that interconnections and multiple layers can be formed after the sheet is made. In addition, it would be desirable to incorporate additional functions such as embedded interconnections, a black matrix for contrast enhancement, wavelength conversion materials, charge storage, addressing means, power conversion, and bias control within the surrounding matrix between semiconducting elements and on the semiconducting elements themselves. In U.S. patent application Ser. No. 12/221,304, which is herein incorporated by reference, Zimmerman et al disclose a method of forming a freestanding, substrate-free epitaxial LED chip based on laser liftoff of thick gallium nitride (GaN) from a sapphire wafer. The resulting epitaxial chip ranges from about 10 microns to over 50 microns in thickness, which is substantially thicker than devices grown by metal organic chemical vapor deposition (MOCVD). It would be desirable to use such chips to create a semiconducting sheet. By comparison, the plastic film industry routinely handles films from about 9 microns to 100 s of microns in thickness. Aluminum foils with thicknesses down to a few microns are found in virtually every kitchen.

SUMMARY OF THE INVENTION

One embodiment of this invention is a substrate-free semiconducting sheet comprising an array of semiconducting elements dispersed in a matrix material. The array of semiconducting elements may be a random array or a regular array. Each semiconducting element has a first surface, a second surface, and one or more edge surfaces connecting the first surface and the second surface. The matrix material is bonded to the edge surfaces of the semiconducting elements. The substrate-free semiconducting sheet is substantially the same thickness as the semiconducting elements. Preferably, the semiconducting sheet and semiconducting elements exhibit a thickness between approximately 10 microns and approximately 200 microns.

Interconnects, either patterned or non-patterned, are formed on one or both sides of the substrate-free semiconducting sheet.

A substrate-free semiconducting sheet can be fabricated that has substantially the same thickness as the semiconducting elements dispersed within the sheet. A semiconducting sheet can be formed by pressing and solvent evaporation.

Inorganic and organic matrix materials may be used to form the substrate-free semiconductor sheet. The matrix material may be flexible or rigid. The matrix material can be an electrical insulator, a conductor or a semiconductor. In the case of thermally robust semiconducting elements, the elements can be incorporated within a high melting point matrix material such as a glass is an embodiment of this invention. For example, nitride-based light emitting diode chips can be incorporated into glass matrix materials. Matrix material of particles that are substantially thinner than either the sheet or the semiconducting elements can be added in order to modify electrical, optical, or other physical properties of the matrix.

The semiconducting elements of this invention may include, but not limited to, light emitting diode chips, substrate-free light emitting diode chips, photovoltaic chips, solar conversion chips, transistor chips, diode chips, wavelength conversion chips and charge storage devices. Multiple elements can be included within the same semiconducting sheet or via stacked sheets. At least one semiconducting sheet can be adhered or bonded to thermal, interconnect, addressing, wavelength conversion, optical, and/or detection means. A semiconducting sheet can form a display, a solar conversion device, or an illumination device.

BRIEF DESCRIPTION OF THE DRAWINGS

A more detailed understanding of the present invention, as well as other objects and advantages thereof not enumerated herein, will become apparent upon consideration of the following detailed description and accompanying drawings, wherein:

FIG. 3 illustrates side cross-sectional views of several types of semiconducting elements of the present invention.

DETAILED DESCRIPTION OF THE PREFERRED EMBODIMENTS

The preferred embodiments of the present invention will be better understood by those skilled in the art by reference to the above listed figures. The preferred embodiments of this invention illustrated in the figures are not intended to be exhaustive or to limit the invention to the precise form disclosed. The figures are chosen to describe or to best explain the principles of the invention and its applicable and practical use to thereby enable others skilled in the art to best utilize the invention.

Figure 1:
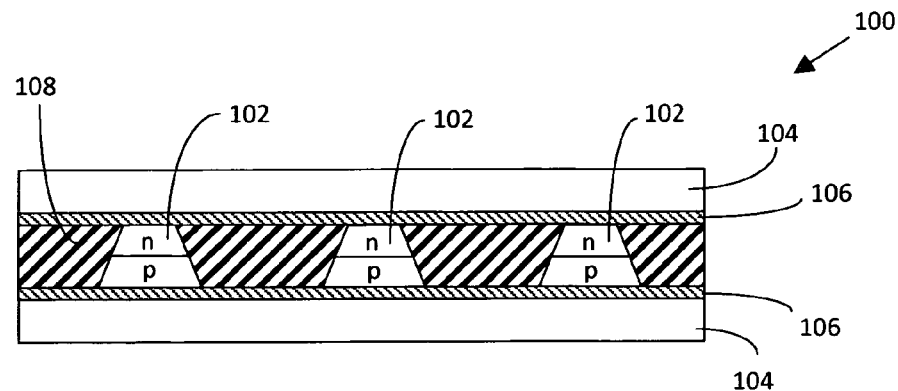
FIG. 1 is a side cross-sectional view of an example of the prior art where LED chips are laminated between two transparent substrates.

FIG. 1 depicts an example of the prior art by Daniels et al in U.S. Pat. No. 7,052,924. In this case, LED die 102 are laminated between two transparent substrates 104. The transparent substrates each have a transparent conductive layer 106 on the inner surface of the substrate. A hot melt adhesive 108 encapsulates the die 102 and bonds the transparent substrates 104 together.

Figure 2:
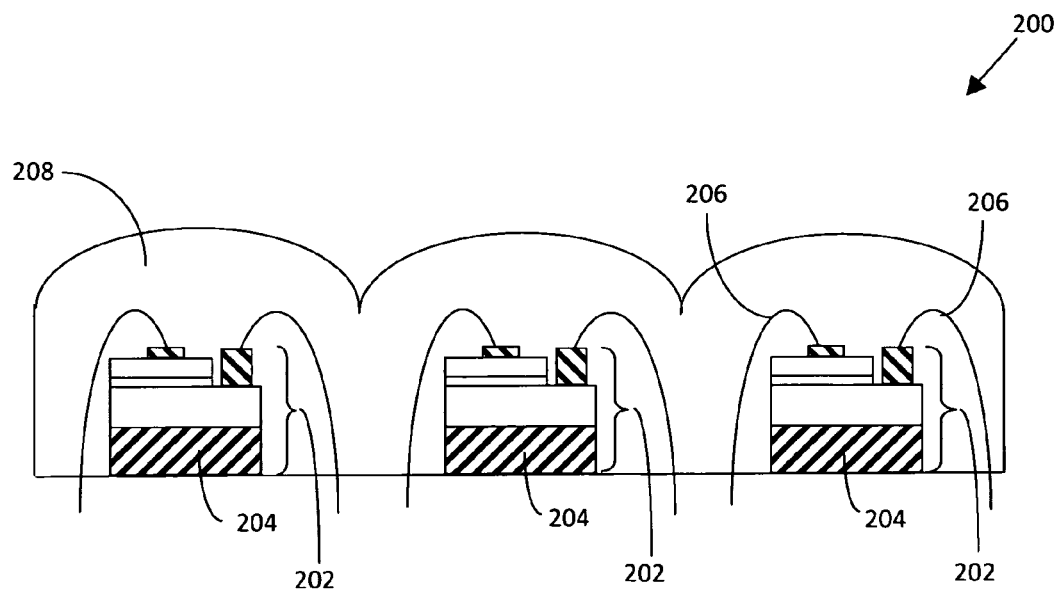
FIG. 2 is a side cross-sectional view of another example of the prior art where LED chips are embedded within a transparent media.

FIG. 2 depicts the prior art in which conventional LED die 202 are embedded within a transparent media 208 and energized through leads 206. The conventional LEDs include transfer substrates 204. In both of the examples illustrated in FIGS. 1 and 2, access to the surfaces of the semiconducting elements is limited by the substrates or by transparent media.

Embodiments of this invention include semiconducting elements that are dispersed in a matrix material and formed into a substrate-free semiconducting sheet. The semiconducting elements include, but are not limited to, light emitting diode chips, substrate-free light emitting diode chips, photovoltaic chips, solar conversion chips, transistor chips, diode chips, wavelength conversion chips, charge storage devices and stacks that include a plurality of sub-elements or chips.

Figure 3A:
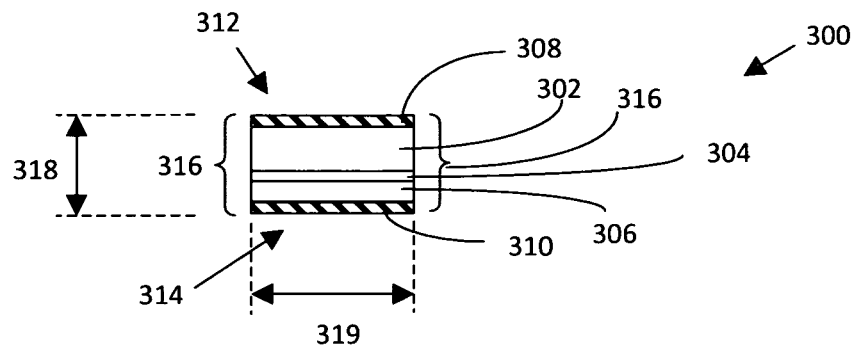
FIG. 3A is a side cross-sectional view of a substrate-free LED chip or photovoltaic chip that has transparent top and bottom electrodes.
Figure 3B:
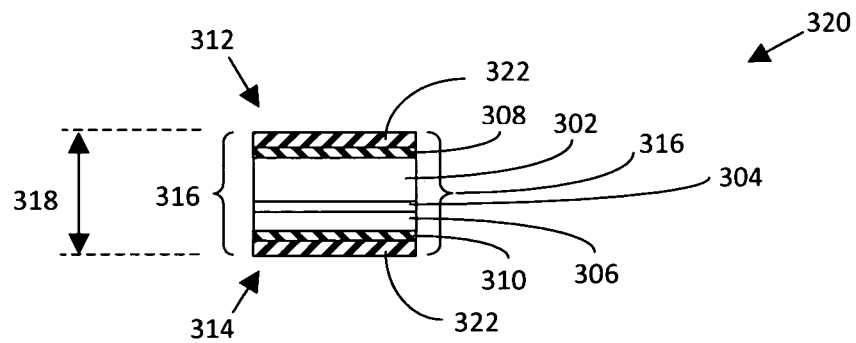
FIG. 3B is a side cross-sectional view of a substrate-free LED chip or photovoltaic chip that has transparent top and bottom electrodes and sacrificial layers on the top and bottom surfaces.
Figure 3C:
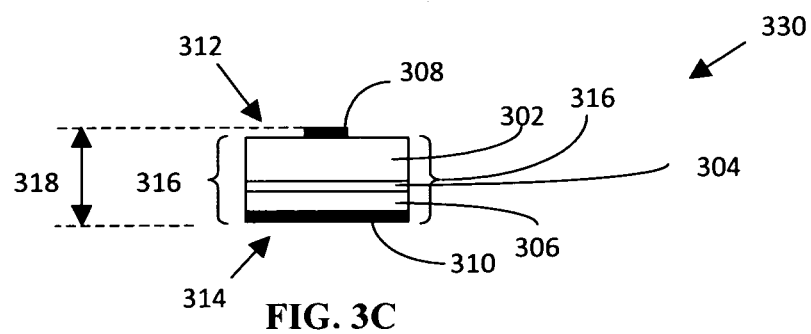
FIG. 3C is a side cross-sectional view of a substrate-free LED chip or photovoltaic chip that has opaque top and bottom electrodes.
Figure 3D:
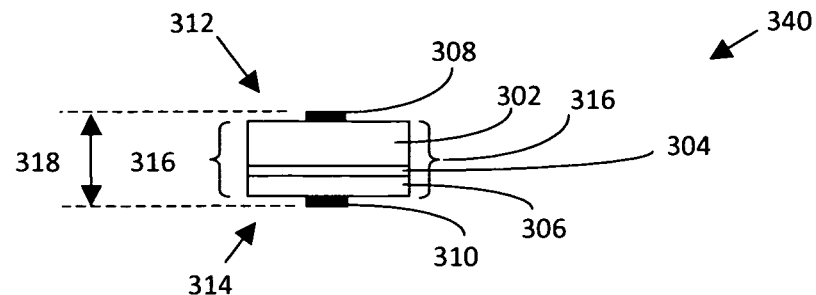
FIG. 3D is a side cross-sectional view of another substrate-free LED chip or photovoltaic chip that has opaque top and bottom electrodes.
Figure 3E:
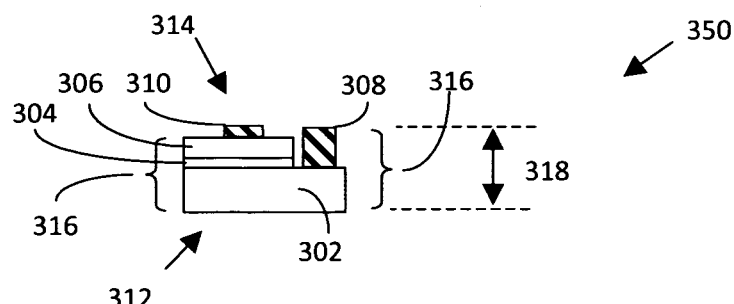
FIG. 3E is a side cross-sectional view of a substrate-free LED chip or photovoltaic chip that has two top electrodes.
Figure 3F:
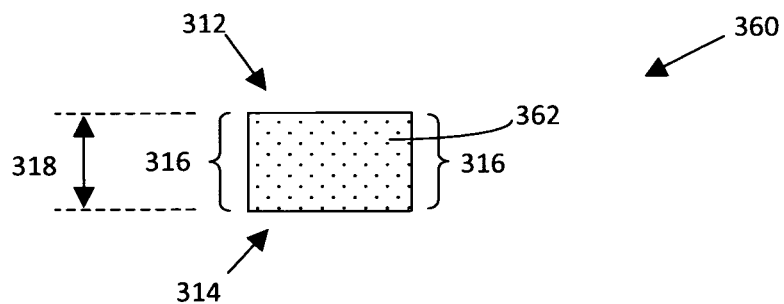
FIG. 3F is a side cross-sectional view of a wavelength conversion chip.
Figure 3G:
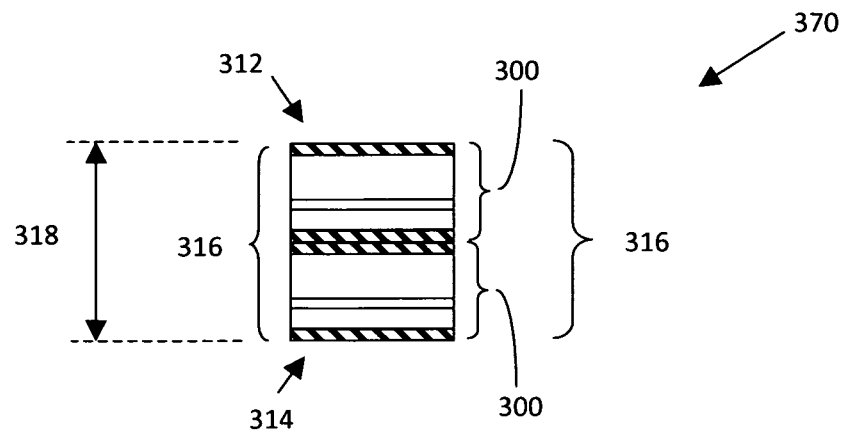
FIG. 3G is a semiconductor element that is a stack of two sub-elements that are substrate-free LED chips or substrate-free photovoltaic chips.
Figure 3H:
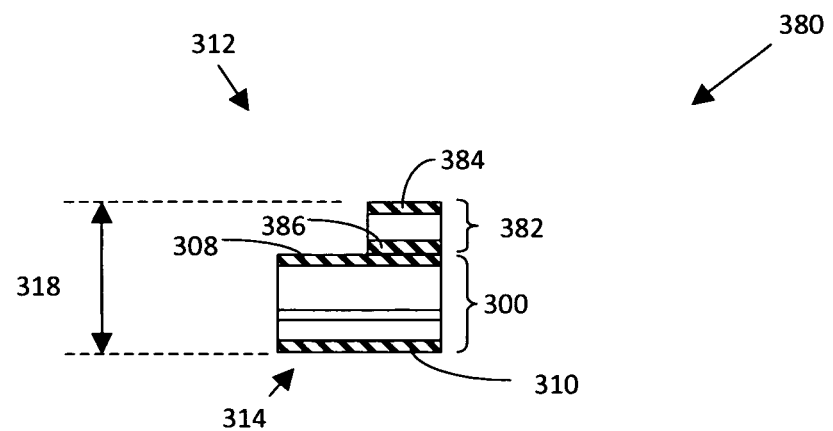
FIG. 3H is a semiconductor element that is a stack of two sub-elements that include a substrate-free LED chip and an electronic circuit chip.

FIGS. 3A to 3H illustrate examples of semiconducting elements of the semiconducting sheet of the present invention. FIGS. 3A to 3E illustrate semiconducting elements that are substrate-free LED chips or substrate-free photovoltaic chips. FIG. 3F illustrates a semiconductor element that is a wavelength conversion chip. FIG. 3G illustrates a semiconductor element that is a stack of two substrate-free LED chips or two substrate-free photovoltaic chips. FIG. 3H illustrates a semiconductor element that is a stack of two sub-elements that include a substrate-free LED chip and an electronic circuit chip.

A substrate-free LED chip or a substrate-free photovoltaic chip is a chip that does not include a growth substrate or a transfer substrate. The substrate-free LED chip or substrate-free photovoltaic chip has a first doped layer, an active region, a second doped layer, a first electrode and a second electrode. If the chip is an LED chip, the active region emits light when a voltage is applied across the two electrodes. If the chip is a photovoltaic chip, the active region absorbs light from an external source (not shown) and generates a voltage across the two electrodes.

In order to have a robust structure, the total thickness the structure, including the first doped layer, the active layer, the second doped layer and the two electrodes, must be large enough so that the LED chip or photovoltaic chip can be handled as a free-standing structure without breaking. The total thickness of the substrate-free LED chip or substrate-free photovoltaic chip that is utilized in this invention is at least 10 microns thick. Preferably, the total thickness of the substrate-free chip is at least 20 microns thick. More preferably, the total thickness of the substrate-free chip is at least 30 microns thick.

In the case of substrate-free LED chips, at least one thick semiconductor layer is utilized. The optical absorption coefficients for the various semiconductor layers must be low in order to prevent the absorption of a significant fraction of the internally generated light emitted by the active region of the chip. Lower optical absorption within the LED chip will result in higher light extraction from the chip and higher external quantum efficiency.

If the semiconductor chip is an LED chip, it is also important for some light recycling applications that the LED chip be highly reflective to any externally incident light. Externally incident light can come from light that is emitted by the LED chip and recycled back to the chip or can come from other light sources. The optical absorption coefficients for the various semiconductor layers must also be low so that any externally incident light that enters the chip will not undergo significant absorption by the semiconductor layers before exiting the chip. Lowering the optical absorption coefficients of the semiconductor layers will increase the reflectivity of the LED chip to externally incident light.

Each semiconductor layer of the LED chip can absorb light and has an absorption coefficient that depends on wavelength. In many cases, the absorption coefficient is not uniform across the different semiconductor layers of the chip. If the different semiconductor layers of the chip have different absorption coefficients, the average absorption coefficient for the multiple semiconductor layers is defined in this specification as the thickness-weighted average absorption coefficient. The weighting function is the fractional thickness of each semiconductor layer in the chip. For example, if 100% of the total thickness of the semiconductor layers has a uniform absorption coefficient of 50 per centimeter, then the thickness-weighted average absorption coefficient is 50 per centimeter. If 50% of the total thickness of the semiconductor layers has an absorption coefficient of 25 per centimeter and 50% of the total thickness of the semiconductor layers has an absorption coefficient of 75 per centimeter, then the thickness-weighted average absorption coefficient is also 50 per centimeter.

In order to improve the light extraction efficiency and external quantum efficiency of an LED chip and to improve the reflectivity of an LED chip to externally incident light, the average absorption coefficient (i.e. the thickness-weighted average absorption coefficient) of the semiconductor layers should be less than 20 per centimeter. Preferably the average absorption coefficient of the semiconductor layers is less than 10 per centimeter. More preferably, the average absorption coefficient of the semiconductor layers is less than 5 per centimeter. Most preferably, the average absorption coefficient of the semiconductor layers is less than 2 per centimeter. Minimizing the average absorption coefficient of the semiconductor layers can be accomplished by improving the deposition processes for the different semiconductor layers in order to reduce impurities and defects and to improve the crystalline structure of the layers.

Thick semiconductor layers for the LED chip or photovoltaic chip can be grown by methods including, but not limited to, chemical vapor deposition (CVD), metal organic chemical vapor deposition (MOCVD), vapor phase epitaxy (VPE), hydride vapor phase epitaxy (HVPE) and molecular beam epitaxy (MBE). MOCVD is the most common method for conventional GaN-based LEDs, but it has relatively slow deposition rates of approximately 0.1 micron per hour. MOCVD deposited layers also have relatively high optical absorption coefficients due to impurities and defects. HVPE has much faster growth rates and is the preferred method for growing GaN layers that are more than 5 microns thick. HVPE can have growth rates of up to 10 microns per hour or more and can produce GaN-based layers that have optical absorption coefficients significantly less than 25 per centimeter.

For example, HVPE can be used to epitaxially grow the first doped layer or the second doped layer or both the first and the second doped layers or all of the semiconductor layers of the semiconductor element. HVPE does not have the carbon impurities that can be present in the MOCVD processes normally used in GaN LED fabrication. Alternatively, if MOCVD is used to deposit the semiconductor layers, a higher deposition temperature can be used to reduce carbon impurities and crystalline defects in the layers. MOCVD may optionally be used to grow active regions that are single- or multiple quantum wells. If the active region of the chip is a p-n heterojunction, preferably all the semiconductor layers are fabricated by HVPE.

A substrate-free LED chip or a substrate-free photovoltaic chip may have two electrodes on one side of the chip, either the "top" side or the "bottom" side. Alternatively, the substrate-free chip may have one electrode on the top side of the chip and one electrode on the bottom side of the chip.

The top and bottom electrodes may be optically transparent, semi-transparent, semi-opaque or opaque. The electrodes may be fabricated from metals, metal alloys, high-temperature-fusible conductive materials, semiconductors or transparent conductive oxides (TCOs). Examples of metals include silver, aluminum, gold, nickel, titanium, chromium, platinum, palladium, rhodium, rhenium, ruthenium and tungsten. Preferred metals are silver and aluminum. An example of a high-temperature-fusible material is a conductive silver paste or ink. Examples of TCOs include indium tin oxide (ITO), zinc oxide (ZnO), indium-doped zinc oxide (IZO), aluminum-doped zinc oxide (AZO), magnesium-doped zinc oxide, gallium-doped zinc oxide and phosphorus-doped zinc oxide. A preferred TCO is aluminum-doped zinc oxide. Preferably the aluminum-doped zinc oxide is fabricated by metal organic chemical vapor deposition (MOCVD) and preferably the aluminum-doped zinc oxide electrode is greater than 500 nanometers thick. The electrodes may also be omni-directional reflectors that include a dielectric layer, a metal layer and have electrically conducting pathways through the metal layer.

If the electrodes are opaque metals, the electrodes should be highly reflective to prevent excessive light absorption inside the chip. Preferably the reflectivity of the opaque metal electrodes is greater than 90 percent. More preferably, the reflectivity of the opaque metal electrodes is greater than 95 percent. Most preferably, the reflectivity of the opaque metal electrodes is greater than 98 percent.

FIG. 3A illustrates a side cross-sectional view of semiconductor element 300 of this invention. Semiconductor element 300 is a substrate-free LED chip or a substrate-free photovoltaic chip. The substrate-free semiconductor element 300 does not include a growth substrate or a transfer substrate. Semiconductor element 300 has a first doped layer 302, an active region 304, a second doped layer 306, a first electrode 308 and a second electrode 310. Semiconductor element 300 has a first side 312 adjacent to the first doped layer, a second side 314 adjacent to the second doped layer and edge surfaces 316 that connect the first side and the second side. If semiconductor element 300 is an LED chip, the active region emits light when a voltage is applied across the two electrodes. If semiconductor element 300 is a photovoltaic chip, the active region absorbs light from an external source (not shown) and generates a voltage across the two electrodes.

To ensure that the substrate-free semiconductor element 300 has a mechanically robust structure, the total thickness 318 of the semiconductor element must be large enough so that the semiconductor element can be handled as free-standing structure without breaking. The total thickness 318 of the semiconductor element 300 is at least 10 microns thick. Preferably the total thickness of the semiconductor element is at least 20 microns thick. More preferably the total thickness of the semiconductor element is at least 30 microns thick.

The width dimension 319 or the length dimension (not shown) of semiconductor element 300 can have any value greater than the total thickness 318 of the element. Preferred values for the width dimension and the length dimension range from about 10 microns to about 10,000 microns. More preferred values for the width dimension and the length dimension range from about 30 microns to about 3,000 microns.

As an illustrative example, semiconductor element 300 is a gallium-nitride based, substrate-free LED chip.

The first electrode 308 of semiconductor element 300 is a transparent electrode that covers substantially all of the first side 312 of the element adjacent to the first doped layer 302. The second electrode 310 is a transparent electrode that covers substantially all of the second side 314 of the element adjacent to the second doped layer 306.

The electrode material for the first and second electrodes is a transparent or semi-transparent conducting material. Preferred materials are TCOs. Examples of TCOs include indium tin oxide (ITO), zinc oxide (ZnO), indium-doped zinc oxide (IZO), aluminum-doped zinc oxide (AZO), magnesium-doped zinc oxide, gallium-doped zinc oxide and phosphorus-doped zinc oxide. In this illustrative example, the TCO material is aluminum-doped zinc oxide and is fabricated by metal-organic chemical vapor deposition (MOCVD). Each TCO electrode is greater than 500 nanometers thick.

The first doped layer 302 is an n-doped GaN layer, which is epitaxially deposited or otherwise conventionally fabricated on a growth substrate (not shown). The growth substrate is later removed by a standard technique such as laser liftoff, chemical processing or mechanical polishing. The first doped layer may be deposited by any standard GaN growth technique. In this example, the first doped layer is deposited by HVPE. The first doped layer is in electrical contact with the active region and the first electrode.

The active region 304 of the semiconductor element 300 can be a p-n homojunction, a p-n heterojunction, a single quantum well or a multiple quantum well of the appropriate semiconductor material for the semiconductor element. The active region may be deposited by any standard GaN growth technique. In this illustrative example, the active region 304 is a multiple quantum well structure that is fabricated by MOCVD. The active region is in electrical contact with the first doped layer and the second doped layer.

The second doped layer 306 is a p-doped GaN layer, which is epitaxially deposited or otherwise conventionally fabricated on the active region 304. The second doped layer is in electrical contact with the active region and the second electrode. The second doped layer may be deposited by any standard GaN growth technique. In this illustrative example, the second doped layer is deposited by HVPE.

FIG. 3B illustrates a side cross-sectional view of semiconductor element 320 of this invention. Semiconductor element 320 is a substrate-free LED chip or a substrate-free photovoltaic chip. Semiconductor element 320 has the same structure as semiconductor element 300 except that semiconductor element 320 includes two sacrificial layers 322. One sacrificial layer 322 substantially covers first side 312 of the semiconductor element and the first electrode 308. Another sacrificial layer substantially covers second side 314 of the semiconductor element and the second electrode 310. The sacrificial layers will later be removed during the fabrication of semiconducting sheets. The sacrificial layers may be formed from any material, organic or inorganic, that can be easily removed when desired. Semiconductor element 320 has a first side 312, a second side 314 and edge surfaces 316 that connect the first side and the second side.

FIG. 3C illustrates a side cross-sectional view of semiconductor element 330 of this invention. Semiconductor element 330 is a substrate-free LED chip or a substrate-free photovoltaic chip. Semiconductor element 330 has a first side 312, a second side 314 and edge surfaces 316 that connect the first side and the second side. Semiconductor element 330 has the same structure as semiconductor element 300 except that the first electrode 308 and the second electrode 310 of semiconductor element 330 are optically opaque electrodes. First electrode 308 covers only a portion of the first side 312 of semiconductor element 330. Second electrode 310 covers substantially all of the second side 314 of semiconductor element 330. Optically opaque electrodes may be fabricated from metals, metal alloys or high-temperature-fusible conductive materials. Examples of metals include silver, aluminum, gold, nickel, titanium, chromium, platinum, palladium, rhodium, rhenium, ruthenium and tungsten. An example of a high-temperature-fusible material is a conductive silver paste or ink. In the example illustrated in FIG. 3C, the electrodes are fabricated from silver.

FIG. 3D illustrates a side cross-sectional view of semiconductor element 340 of the present invention. Semiconductor element 340 is a substrate-free LED chip or a substrate-free photovoltaic chip. Semiconductor element 340 has a first side 312, a second side 314 and edge surfaces 316 that connect the first side and the second side. Semiconductor element 340 has the same structure as semiconductor element 300 except that the first electrode 308 and the second electrode 310 of semiconductor element 340 are optically opaque electrodes. First electrode 308 covers only a portion of the first side 312 of semiconductor element 340. Second electrode 310 covers only a portion of the second side 314 of semiconductor element 340. Optically opaque electrodes may be fabricated from metals, metal alloys or high-temperature-fusible conductive materials. Examples of metals include silver, aluminum, gold, nickel, titanium, chromium, platinum, palladium, rhodium, rhenium, ruthenium and tungsten. An example of a high-temperature-fusible material is a conductive silver paste or ink. In the example illustrated in FIG. 3D, the electrodes are fabricated from silver.

FIG. 3E illustrates a side cross-sectional view of semiconductor element 350 of the present invention. Semiconductor element 350 is a substrate-free LED chip or a substrate-free photovoltaic chip. Semiconductor element 350 has a first side 312 (the bottom side in this example), a second side 314 (the top side in this example) and edge surfaces 316 that connect the first side and the second side. Semiconductor element 350 has the same structure as semiconductor element 300 except that the first electrode 308 and the second electrode 310 of semiconductor element 350 are optically opaque electrodes and both electrodes are located on the second side 314 of semiconductor element 350. In FIG. 3E, the second side 314 of the element is the top side of the element and is adjacent to the second doped layer, which is also on the top side of the element. First electrode 308 covers only a portion of the second side 314 of semiconductor element 340 in an area where a portion of the second doped layer 306 and the active region 304 have been removed. The first electrode 308 is in electrical contact with the first doped layer 302. Second electrode 310 covers only a portion of second side 314 of semiconductor element 350 and is in electrical contact with the second doped layer 306. In the example illustrated in FIG. 3D, the electrodes are fabricated from silver.

FIG. 3F illustrates a side cross-sectional view of another semiconductor element 360 of the present invention. Semiconductor element 360 is a wavelength conversion chip that converts light of a first wavelength range that is emitted by an LED into light of a second wavelength range, where the second wavelength range is different from the first wavelength range. The semiconductor element 360 has a first side 312, a second side 314, edge surfaces 316 that connect the first side and the second side, and a thickness 318.

The semiconductor element 360 is fabricated from one or more wavelength conversion materials 362. The wavelength conversion materials may be, for example, phosphor materials or quantum dot materials. The phosphor materials may be in the form of powders, ceramics, thin film solids or bulk solids. Preferred forms are ceramics and thin solid films. The wavelength conversion layer may also be formed from two or more different wavelength conversion materials. In addition, the wavelength conversion layer may also include optically inert host materials for the phosphor or quantum dot wavelength conversion materials.

Phosphor materials are typically optical inorganic materials doped with ions of lanthanide (rare earth) elements or, alternatively, ions such as chromium, titanium, vanadium, cobalt, manganese or magnesium. The lanthanide elements are lanthanum, cerium, praseodymium, neodymium, promethium, samarium, europium, gadolinium, terbium, dysprosium, holmium, erbium, thulium, ytterbium and lutetium. Optical inorganic materials include, but are not limited to, sapphire ($Al_2O_3$), gallium arsenide (GaAs), beryllium aluminum oxide ($BeAl_2O_4$), magnesium fluoride ($MgF_2$), indium phosphide (InP), gallium phosphide (GaP), yttrium aluminum garnet (YAG or $Y_3Al_5O_{12}$), terbium-containing garnet, yttrium-aluminum-lanthanide oxide compounds, yttrium-aluminum-lanthanide-gallium oxide compounds, yttrium oxide ($Y_2O_3$), calcium or strontium or barium halophosphates $(Ca,Sr,Ba)_5(PO_4)_3(Cl,F)$, the compound $CeMgAl_{11}O_{19}$, lanthanum phosphate ($LaPO_4$), lanthanide pentaborate materials ($(lanthanide)(Mg,Zn)B_5O_{10}$), the compound $BaMgAl_{10}O_{17}$, the compound $SrGa_2S_4$, the compounds $(Sr,Mg,Ca,Ba)(Ga,Al,In)_2S_4$, the compound SrS, the compound ZnS, doped zinc oxide (ZnO) and nitridosilicate. There are several exemplary phosphors that can be excited at 250 nm or thereabouts. An exemplary red emitting phosphor is $Y_2O_3:Eu^{3+}$. An exemplary yellow emitting phosphor is YAG:$Ce^{3+}$. Exemplary green emitting phosphors include $CeMgAl_{11}O_{19}:Tb^{3+}$, $((lanthanide)PO_4:Ce^{3+},Tb^{3+})$ and $GdMgB_5O_{10}:Ce^{3+},Tb^{3+}$. Exemplary blue emitting phosphors are $BaMgAl_{10}O_{17}:Eu^{2+}$ and $(Sr,Ba,Ca)_5(PO_4)_3Cl:Eu^{2+}$. For longer wavelength LED excitation in the 400-450 nm wavelength region or thereabouts, exemplary optical inorganic materials include yttrium aluminum garnet (YAG or $Y_3Al_5O_{12}$), terbium-containing garnet, yttrium oxide ($Y_2O_3$), $YVO_4$, $SrGa_2S_4$, $(Sr,Mg,Ca,Ba)(Ga,Al,In)_2S_4$, SrS, and nitridosilicate. Exemplary phosphors for LED excitation in the 400-450 nm wavelength region include YAG:$Ce^{3+}$, YAG:$Ho^{3+}$, YAG:$Pr^{3+}$, YAG:$Tb^{3+}$, YAG:$Cr^{3+}$, YAG:$Cr^{4+}$, $SrGa_2S_4:Eu^{2+}$, $SrGa_2S_4:Ce^{3+}$, $SrS:Eu^{2+}$ and nitridosilicates doped with $Eu^{2+}$. Other phosphor materials not listed here are also within the scope of this invention.

Quantum dot materials are small particles of inorganic semiconductors having particle sizes less than about 30 nanometers. Exemplary quantum dot materials include, but are not limited to, small particles of CdS, CdSe, ZnSe, InAs, GaAs and GaN. Quantum dot materials can absorb light at first wavelength and then emit light at a second wavelength, where the second wavelength is longer than the first wavelength. The wavelength of the emitted light depends on the particle size, the particle surface properties, and the inorganic semiconductor material.

The transparent and optically inert host materials are especially useful to process phosphor powders or to spatially separate quantum dots. Host materials include polymer materials and inorganic materials. The polymer materials include, but are not limited to, acrylates, polystyrene, polycarbonate, fluoroacrylates, chlorofluoroacrylates, perfluoroacrylates, fluorophosphinate polymers, fluorinated polyimides, polytetrafluoroethylene, fluorosilicones, sol-gels, epoxies, thermoplastics, thermosetting plastics and silicones. Fluorinated polymers are especially useful at ultraviolet wavelengths less than 400 nanometers and infrared wavelengths greater than 700 nanometers owing to their low light absorption in those wavelength ranges. Exemplary inorganic materials include, but are not limited to, silicon dioxide, optical glasses and chalcogenide glasses.

A wavelength conversion layer can be formed by depositing phosphor materials onto an inert substrate using any one of a variety of techniques or formed by extrusion. The techniques include, but are not limited to, chemical vapor deposition (CVD), metal-organic chemical vapor deposition (MOCVD), sputtering, electron beam evaporation, laser deposition, sol-gel deposition, molecular beam epitaxy (MBE), liquid phase epitaxy (LPE), spin coating, slip casting, doctor blading and tape casting. Preferred techniques include slip casting, doctor blading, tape casting, CVD, MOCVD and sputtering. More preferred techniques include slip casting and tape casting. When the wavelength conversion layer is formed from quantum dot materials and inert host materials, deposition techniques include spin coating, slip casting, doctor blading, tape casting, self assembly, lithography, and nanoimprinting.

After a wavelength conversion layer is formed, it usually must be annealed. Annealing can take place in air or in an inert atmosphere using a high temperature furnace. After the annealing step, the layer can be diced to form wavelength conversion chips.

FIG. 3G illustrates a side cross-sectional view of semiconductor element 370 of the present invention. Semiconductor element 370 is a stack of two semiconductor sub-elements 300. Semiconductor element 370 has a first side 312, a second side 314 and edge surfaces 316 that connect the first side and the second side. In this illustrative example, the semiconductor sub-elements are substrate-free LED chips that have transparent electrodes. The two semiconductor sub-elements 300 are bonded together, using a thermal bonding process, to form semiconductor element 370. Semiconductor element 370 has thickness 318. It is within the scope of this invention that the stack may be comprised of different types of semiconductor sub-elements or the stack may include more than two semiconductor sub-elements.

FIG. 3H illustrates a side cross-sectional view of semiconductor element 380 of this invention. Semiconductor element 380 is a stack of two semiconductor sub-elements. One of the sub-elements is semiconductor element 300, where semiconductor element 300 is a substrate-free LED chip. The other semiconductor sub-element is a semiconductor chip 382 that includes, for example, a transistor or an electrical integrated circuit. Semiconductor chip 382 has a first electrode 384 and a second electrode 386. Second electrode 386 of semiconductor chip 382 is adjacent to first electrode 308 of semiconductor element 300. In this illustrative example, the semiconductor sub-elements are substrate-free chips that have transparent electrodes. The two semiconductor sub-elements are bonded together, using a thermal bonding process, to form semiconductor element 380. Semiconductor element 380 has a first side 312, a second side 314 and edge surfaces 316 that connect the first side and the second side. Semiconductor element 380 has thickness 318. It is within the scope of this invention that the stack may be comprised of different types of semiconductor sub-elements or the stack may have more than two semiconductor sub-elements.

The combination of functional elements can be used to add additional functionality to the semiconducting element 380 prior to incorporation into the semiconducting sheets that are described below. For example, an active-matrix addressing semiconducting element maybe incorporated onto a light emitting diode semiconducting element. The active-matrix addressing electrical circuit eliminates the need for active-matrix backplanes as practiced in present day LCD display fabrication. The resulting semiconducting sheet would only require external interconnects to realize an actively addressed matrix of LEDs, either based on regular pattern of semiconductor elements or based on a random distribution of very small semiconducting elements, such that each pixel consists of several addressable semiconducting elements. Such a semiconducting sheet can be utilized as a display device.

FIGS. 3A to 3H illustrate examples of semiconducting elements. Embodiments of this invention utilize the semiconducting elements to form substrate-free semiconducting sheets. Examples of substrate-free semiconducting sheets are illustrated below. The substrate-free semiconducting sheets can be used for applications in illumination, solar energy conversion and displays.

A substrate-free semiconducting sheet of this invention comprises an array of semiconducting elements dispersed in a matrix material. The array of semiconducting elements can be a random array or a regular array. Each semiconducting element in the array has a first surface, a second surface and one or more edge surfaces connecting the first surface and the second surface. The matrix material is bonded to the edge surfaces of the semiconducting elements. The substrate-free semiconducting sheet is substantially the same thickness as the semiconducting elements.

Figure 4A:
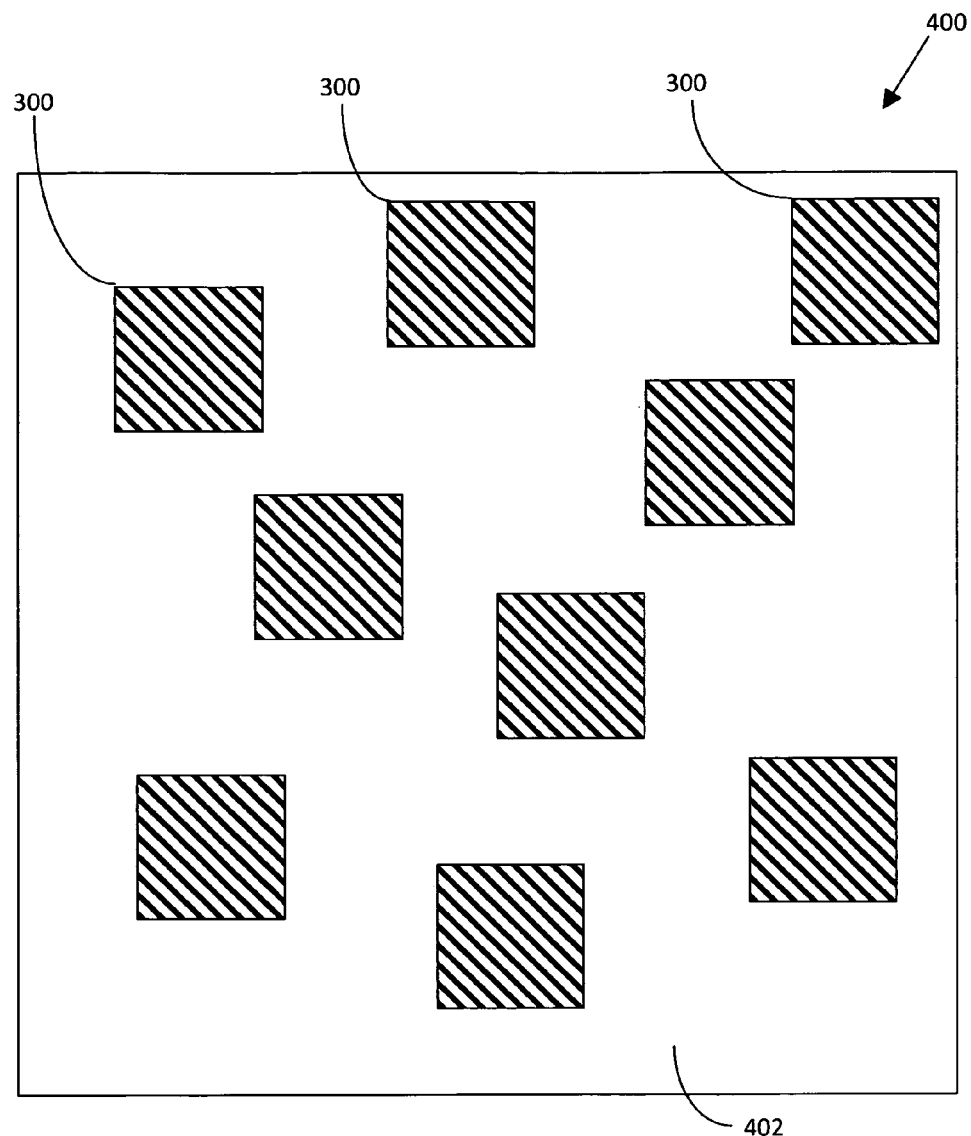
FIG. 4A is a top plan view of a substrate-free semiconducting sheet of the present invention where the semiconducting elements are arranged in a random array.

One embodiment of this invention is illustrated in FIG. 4A. FIG. 4A is a top plan view of a substrate-free semiconducting sheet 400 comprising a random array of semiconducting elements 300 dispersed in a matrix material 402.

Figure 4B:
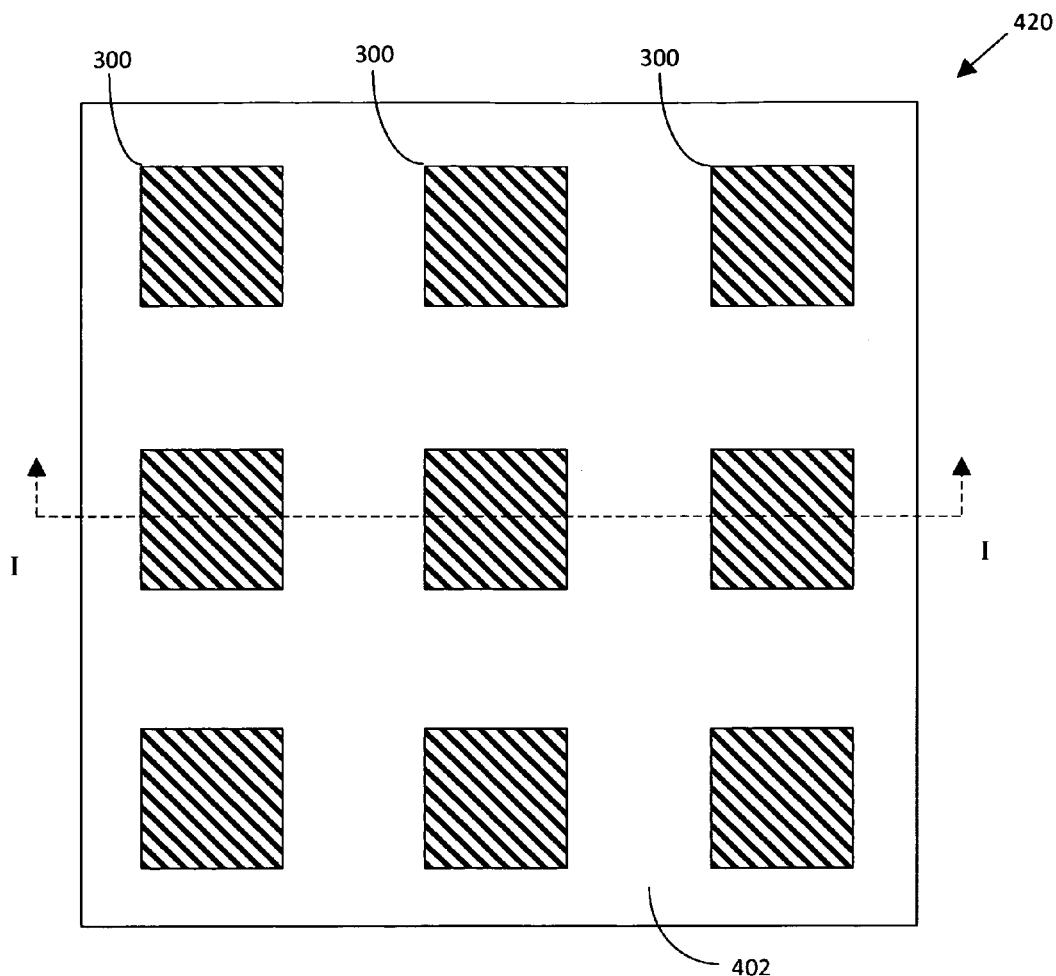
FIG. 4B is a top plan view of a substrate-free semiconducting sheet of the present invention where the semiconducting elements are arranged in a regular array.
Figure 4C:
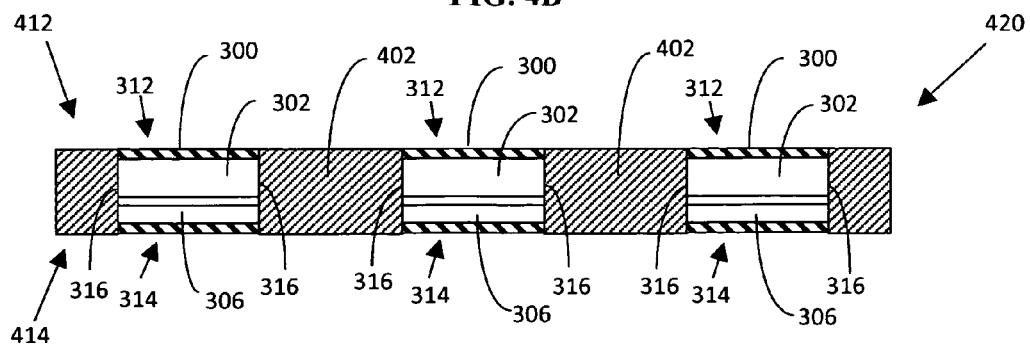
FIG. 4C is a side cross-sectional view of the substrate-free semiconducting sheet of FIG. 4B viewed along the I-I plane where the semiconducting elements have the same electrical orientation.

Another embodiment of this invention is illustrated in FIGS. 4B and 4C. FIG. 4B is a top plan view of a substrate-free semiconducting sheet 420 comprising a regular array of semiconducting elements 300 dispersed in a matrix material 402. FIG. 4C is a side cross-sectional view along the I-I plane of the substrate-free semiconducting sheet 420 illustrated in FIG. 4B. The substrate-free semiconducting sheet 420 is a free-standing sheet that requires no additional substrate for support. The matrix material 402 is bonded to the edge surfaces 316 of the semiconducting elements 300.

In FIG. 4C, the semiconducting elements 300 all have the same electrical orientation. The first side 312 and the first doped layer 302 of each semiconducting element are adjacent to the first side 412 of the semiconducting sheet 420. The second side 314 and the second doped layer 306 of each semiconducting element are adjacent to the second side 414 of the semiconducting sheet 420.

Although semiconducting sheet 420 is illustrated using only semiconducting elements 300, it is within the scope of this invention that the semiconducting elements can be, but are not limited to, any of the types of semiconducting elements illustrated in FIGS. 3A to 3H. A semiconducting sheet may include only one type of semiconducting element or the semiconducting sheet may incorporate more than one type of semiconducting element.

The matrix material 402 can be an organic material, an inorganic material or a mixture of organic and inorganic materials. The matrix material can be flexible or rigid. The matrix material can be an electrical insulator, a conductor or a semiconductor. Example organic materials are hot melt adhesives, ultraviolet-light curable materials, moisture curable materials, porous materials used in printed circuit board (PCB) bond plies and B-staged materials known in the PCB art. The combination of organic and inorganic matrix materials can be used to impart stiffness to the semiconducting sheet.

If the semiconducting elements are thermally robust, the matrix material 402 can be an inorganic material with a high melting point such as a glass. For example, the matrix material can be an inorganic glass if the semiconducting elements 300 are gallium nitride based LEDs that utilize transparent aluminum-doped zinc oxide electrodes that can withstand high processing temperatures.

Matrix material of particles that are substantially thinner than either the semiconducting sheet or the semiconducting elements can be added in order to modify the electrical, optical, thermal, structural or other physical properties of the matrix. Example particles include phosphors, quantum dots, metal particles and carbon black.

Figure 4D:
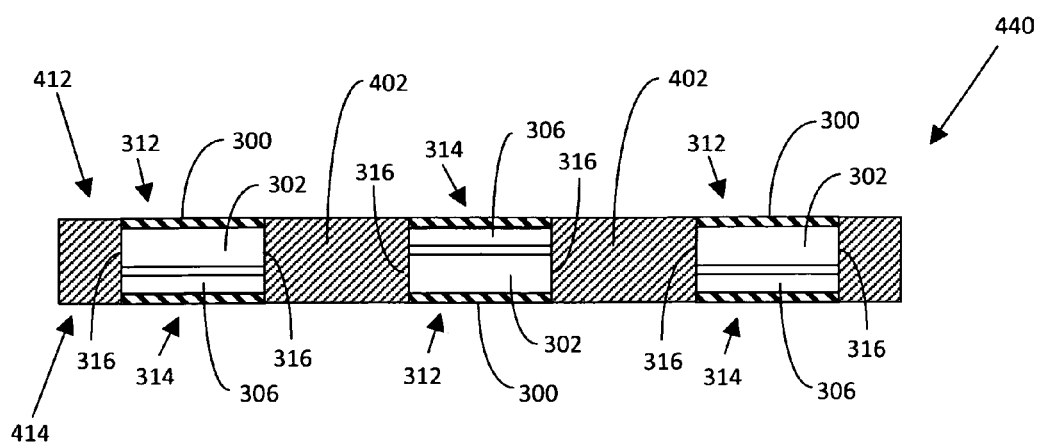
FIG. 4D is a side cross-sectional view of another substrate-free semiconducting sheet where the semiconducting elements have different electrical orientations.

FIG. 4D illustrates another embodiment of the present invention where the semiconducting elements 300 are not all oriented in the same direction. FIG. 4D is a side cross-sectional view of the substrate-fee semiconducting sheet 440. In FIG. 4D, for example, the center semiconducting element has a different electrical orientation than the two end semiconducting elements. The first side 312 and the first doped layer 302 of the center semiconducting element are adjacent to the second side 414 of the semiconducting sheet 440. The second side 314 and the second doped layer 306 of the center semiconducting element are adjacent to the first side 412 of the semiconducting sheet 440. In contrast to the center semiconducting element, the first side 312 and the first doped layer 302 of the two end semiconducting elements are adjacent to the first side 412 of the semiconducting sheet 440. The second side 314 and the second doped layer 306 of the two end semiconducting elements are adjacent to the second side 414 of the semiconducting sheet 440.

The previous examples illustrate various embodiments of semiconducting elements and semiconducting sheets of this invention. Methods to fabricate semiconducting sheets will now be described.

Figure 5A:
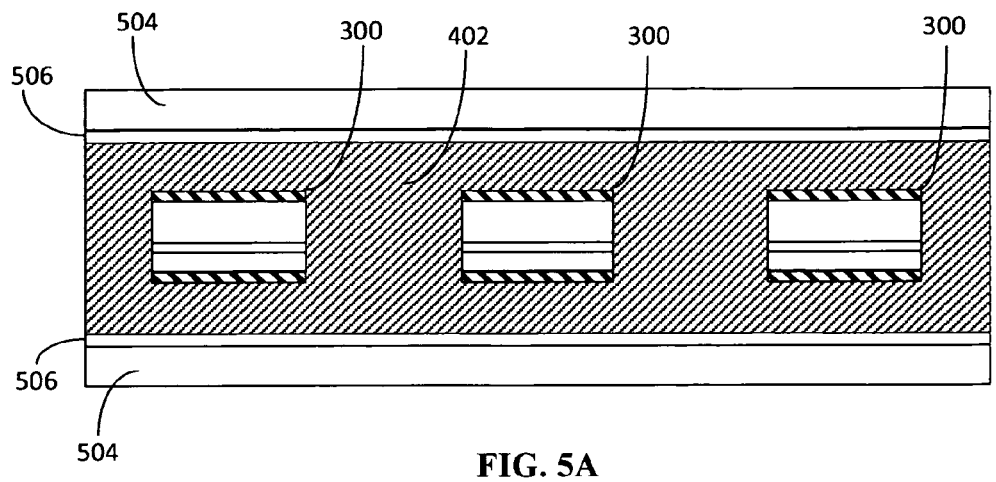
FIGS. 5A to 5C illustrate the formation of a semiconducting sheet by using pressure of the present invention.
Figure 5B:
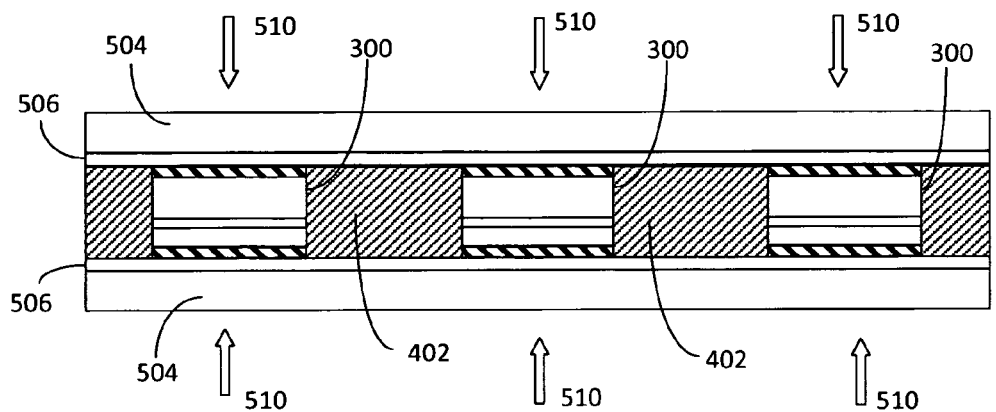
Figure 5C:
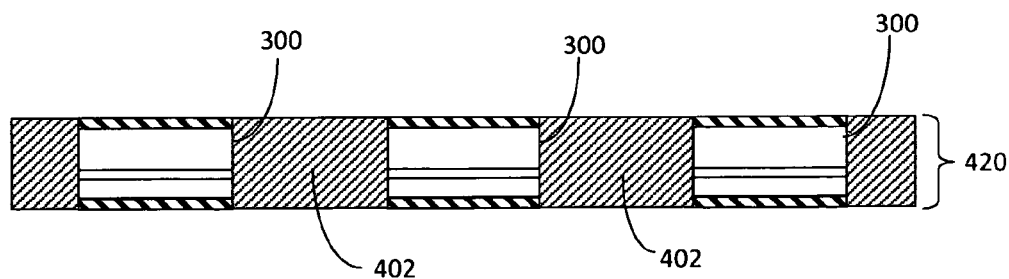

One embodiment of this invention is a method for fabricating a semiconducting sheet. The method is illustrated by FIGS. 5A to 5C. In FIG. 5A, a plurality of semiconducting elements 300 are mixed with a matrix material 402. For simplicity, only semiconducting element 300 is illustrated in FIG. 5A. It is within the scope of this invention that the semiconducting elements used in this method may include, but are not limited to, any of the semiconducting elements illustrated in FIGS. 3A to 3H. In this example, the semiconducting elements have the same electrical orientation. However, it is not necessary that the elements have the same orientation.

The temperature of the matrix material in FIG. 5A is above the melting point of the material and the matrix material is in a molten state. Examples of matrix materials have been described above.

The mixture is placed between two heated platens 504 as illustrated in FIG. 5A. The platens may optionally include release layers 506.

As illustrated in FIG. 5B, the platens with optional release layers 506 are pressed together using pressure 510 until the release layers are separated by approximately the thickness of the semiconducting elements.

After cooling the mixture to below the melting point of the matrix material, the semiconducting sheet is removed from the platens resulting in semiconductor sheet 420 illustrated in FIG. 5C.

Figure 6A:
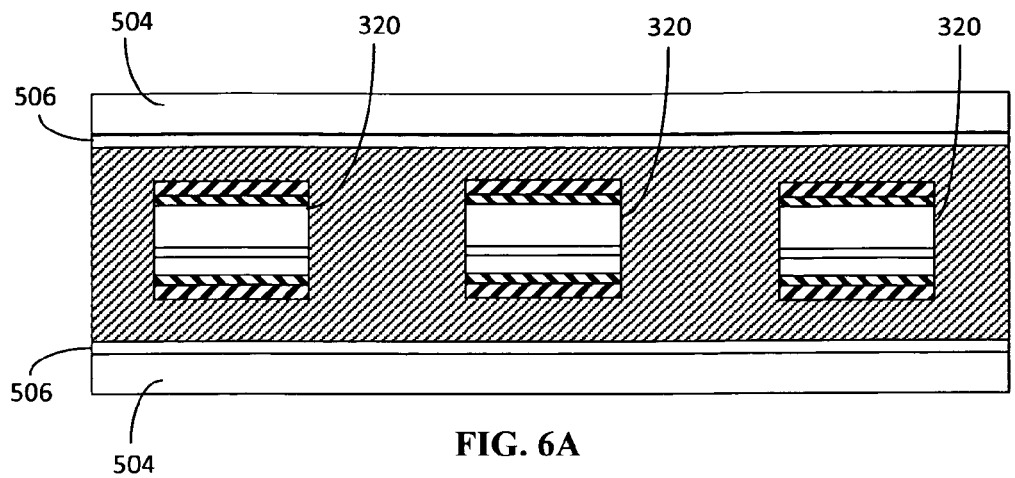
FIGS. 6A to 6D illustrate another method to form a semiconducting sheet of the present invention.
Figure 6B:
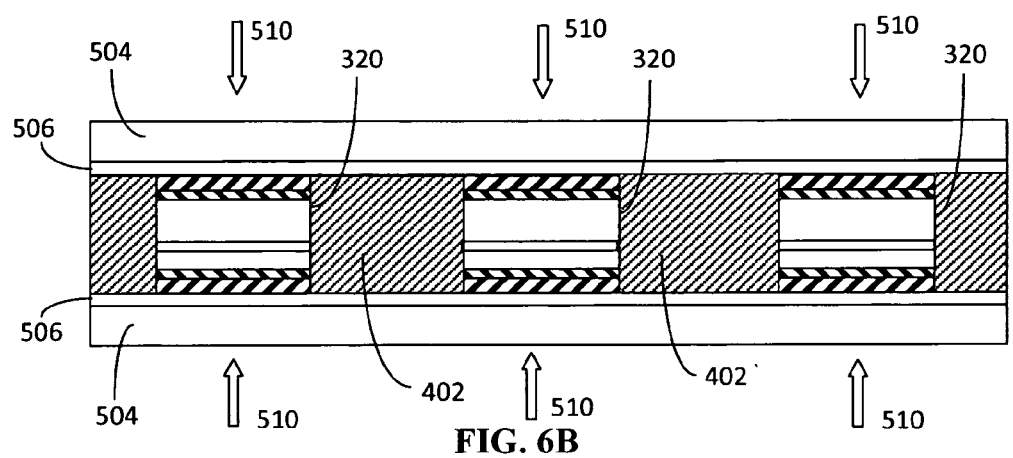
Figure 6C:
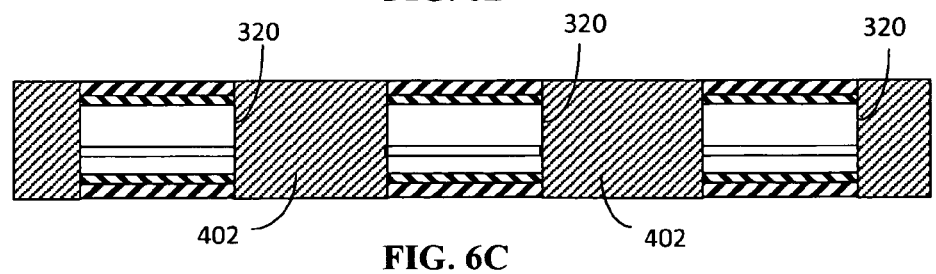
Figure 6D:
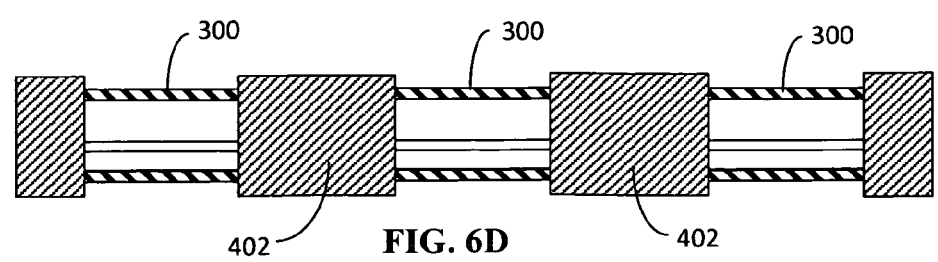

Another embodiment of this invention is a method for fabricating a semiconducting sheet using semiconducting elements 320 that include sacrificial layers on the first and second sides of the elements. FIGS. 6A to 6C illustrate fabrication steps that are equivalent to the steps shown in FIGS. 5A to 5C. In FIG. 6D, the sacrificial layers are removed from the semiconductor elements after the semiconductor sheet is removed from the platens. Removal methods are performed by standard techniques, such as dissolving the sacrificial layers using a solvent, or utilizing liftoff, thermal degradation, plasma cleaning, or radiation breakdown 510 to remove the sacrificial layers.

Figure 7A:
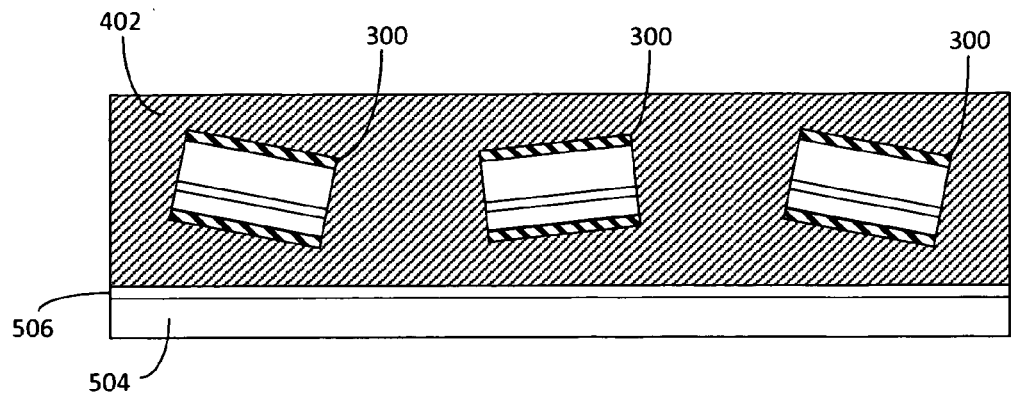
FIGS. 7A to 7D illustrate the formation of a semiconducting sheet using solvent evaporation of the present invention.
Figure 7B:
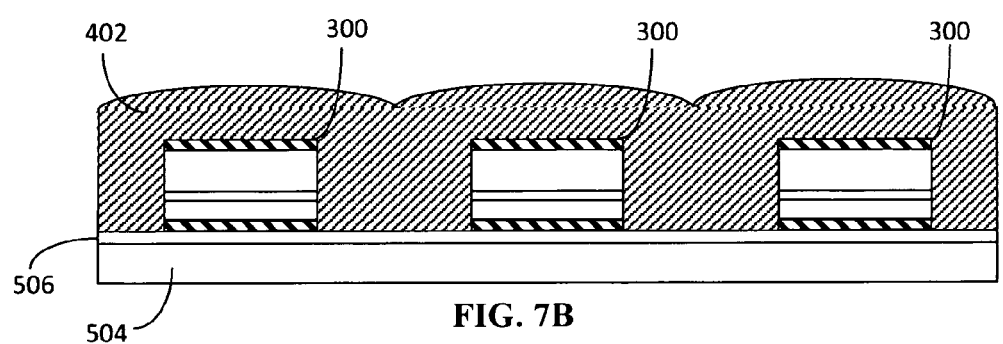
Figure 7C:
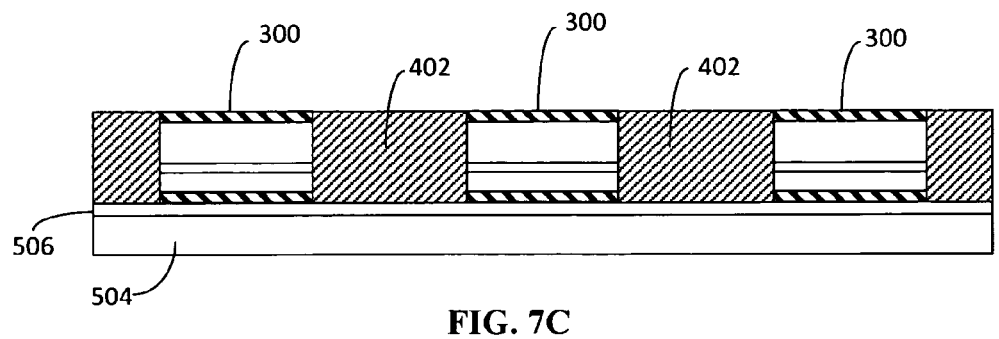
Figure 7D:
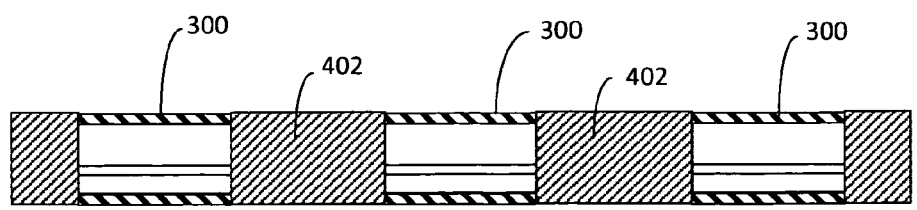

Another embodiment of this invention is a method for fabricating a semiconducting sheet using solvent evaporation. This method is illustrated in FIGS. 7A to 7D. In FIG. 7A, a mixture containing a plurality of semiconductor elements 300, a matrix material 402 and a solvent (not illustrated) is placed on a platen 504. The platen is optionally coated with a release layer 506. The solvent is evaporated, leaving the semiconductor elements in contact with the release layer and covered with excess matrix material as illustrated in FIG. 7B. The excess matrix material covering the top surfaces of the semiconductor elements is removed as shown in FIG. 7C by methods know in the art. Known methods include, but not limited to, chemical mechanical polishing (CMP), plasma etching, lapping, and other polishing techniques. The semiconducting elements 300 can act as stops for mechanical polishing. In FIG. 7D, the semiconducting sheet is removed from the platen.

Figure 8A:
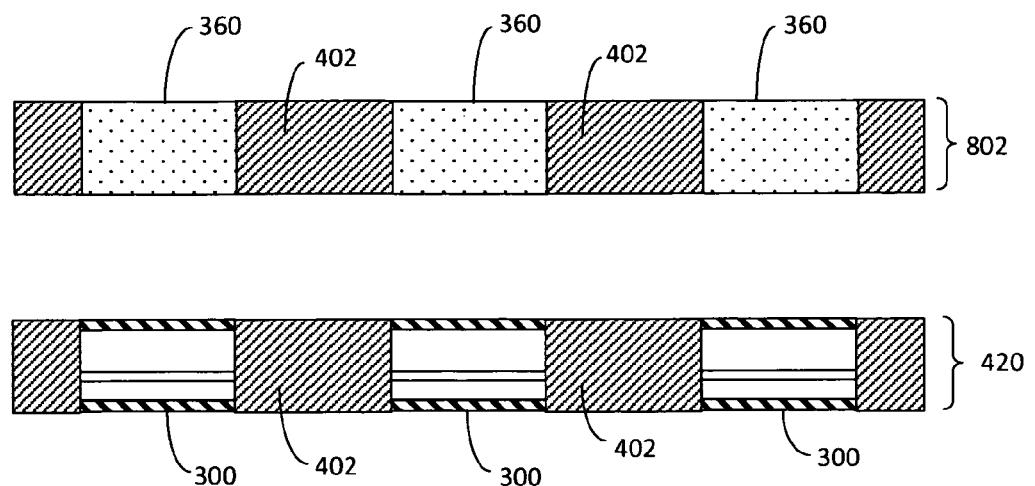
FIGS. 8A and 8B depict bonding together of two different semiconducting sheets of the present invention.
Figure 8B:
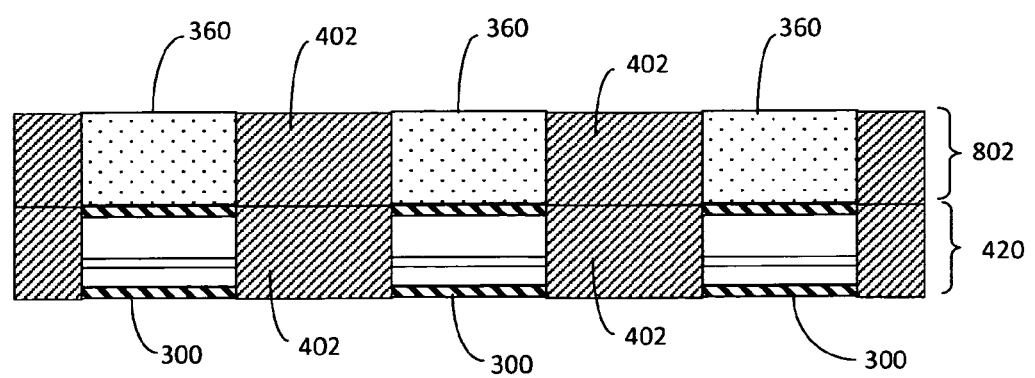

Another embodiment of this invention is shown in FIGS. 8A to 8B. FIGS. 8A and 8B illustrate the bonding of two different semiconducting sheets 802 and 420. In this example, semiconducting sheet 802 incorporates wavelength conversion semiconducting elements 360 and semiconducting sheet 420 incorporates substrate-free LEDs 300.

Figure 9:
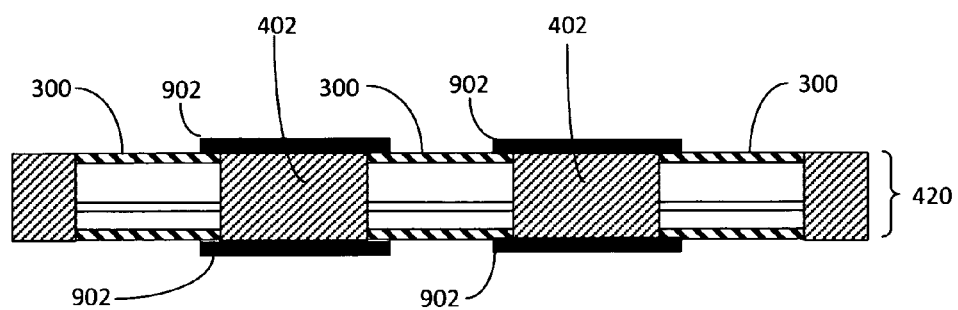
FIG. 9 illustrates electrical interconnections to the semiconducting elements in a semiconducting sheet of the present invention.

Another embodiment of this invention is illustrated in FIG. 9. FIG. 9 depicts a semiconducting sheet 420 in which semiconducting elements 300 are electrically interconnected via interconnecting means 902. The interconnecting means may include, but are not limited to, transparent conductive oxides interconnections, metals, electrolytes, organic conductors, and additional semiconducting elements.

Figure 10:
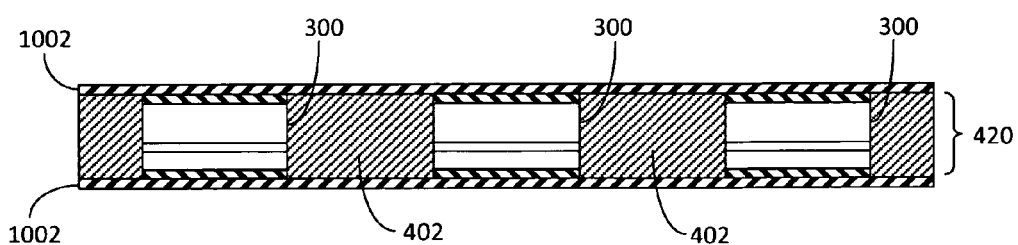
FIG. 10 illustrates another type of electrical interconnection to the semiconducting elements in a semiconducting sheet of the present invention.

Another embodiment of this invention is shown in FIG. 10. FIG. 10 depicts a semiconducting sheet containing semiconducting elements 300 and having interconnection means 1002 fabricated on the upper and lower surfaces of the sheet. The interconnect means 1002 may include, but are not limited to, transparent conductive layers, metals, electrolytes, organic conductors and larger electrical structures such as active matrix backplanes. If the interconnect means is an active matrix backplane and the semiconducting elements 300 are LEDs, a fully addressable LED-based display can be realized.

Figure 11:
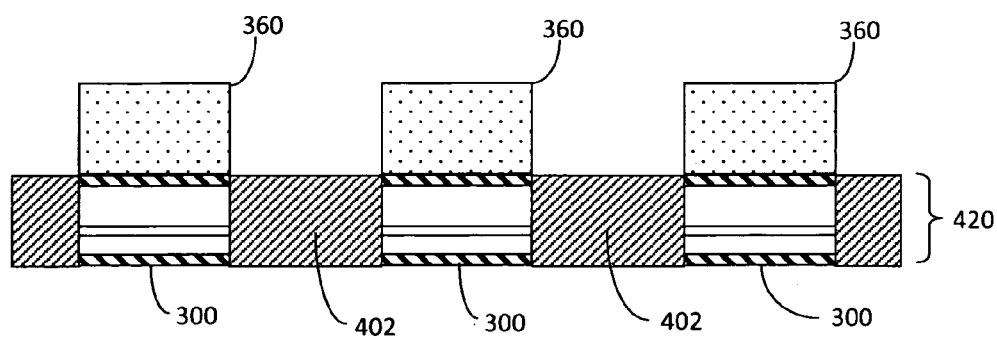
FIG. 11 illustrates a semiconducting sheet with externally attached wavelength conversion elements of the present invention.

Another embodiment of this invention is shown in FIG. 11. FIG. 11 depicts the bonding of wavelength conversion elements 360 to the semiconducting sheet. The semiconductor sheet incorporates semiconducting elements 300. The wavelength conversion elements 360 are bonded at the semiconducting elements 300. The resulting structure can be used in an illumination device.

While the invention has been described in conjunction with specific embodiments and examples, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. A method of fabricating a substrate-free semiconducting sheet, comprising the steps of:
    providing a mixture having a plurality of semiconducting elements and a matrix material, wherein said matrix material is in a molten state;
    placing said mixture between two platens;
    pressing said platens together such that said platens are separated by approximately the thickness of said semiconducting elements;
    cooling said matrix material below its melting point, to form a substrate-free semiconducting sheet; and
    removing said substrate-free semiconducting sheet from said platens.

2. The method of claim 1, wherein said platens include a release layer.

3. The method of claim 1, wherein:
    said semiconducting elements include sacrificial layers; and
    wherein said sacrificial layers are removed from said semiconducting elements following said step of removing said substrate-free semiconducting sheet from said platens.

4. A method of fabricating a substrate-free semiconducting sheet, comprising the steps of:
    providing a mixture that includes a plurality of semiconducting elements, a matrix material and a solvent, wherein said semiconducting elements and said matrix material are dispersed in said solvent;
    placing said mixture on a platen;
    evaporating said solvent from said mixture;
    removing any excess of said matrix material to expose one surface of each of said semiconducting elements to form a substrate-free semiconducting sheet; and
    removing said substrate-free semiconducting sheet from said platen.

5. A substrate-free semiconducting sheet, fabricated in accordance with a method comprising the steps of:
    providing a mixture having a plurality of semiconducting elements and a matrix material, wherein said matrix material is in a molten state;
    placing said mixture between two platens;

pressing said platens together such that said platens are separated by approximately the thickness of said semiconducting elements;

cooling said matrix material below its melting point, to form a substrate-free semiconducting sheet; and removing said substrate-free semiconducting sheet from said platens.

6. A substrate-free semiconducting sheet as defined in claim 5, wherein said substrate-free semiconducting sheet is an illumination device and said semiconductor elements include light emitting diodes.

7. A substrate-free semiconducting sheet as defined in claim 5, wherein said substrate-free semiconducting sheet is a solar conversion device and said semiconducting elements include photovoltaic chips or solar conversion chips.

8. A substrate-free semiconducting sheet as defined in claim 5, wherein said substrate-free semiconducting sheet is a wavelength conversion device and said semiconducting elements include wavelength conversion chips.

9. A substrate-free semiconducting sheet as defined in claim 5, wherein said substrate-free semiconducting sheet is a display device and said semiconducting elements include light emitting elements.

10. A substrate-free semiconducting sheet as defined in claim 5, wherein said substrate-free semiconducting sheet is a charge storage device and said semiconductor elements include charge storage elements.

* * * * *